(12) United States Patent
Chen et al.

(10) Patent No.: US 11,935,954 B2
(45) Date of Patent: Mar. 19, 2024

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Bwo-Ning Chen, Keelung (TW); Xusheng Wu, Hsinchu (TW); Chang-Miao Liu, Hsinchu (TW); Chien-Tai Chan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 222 days.

(21) Appl. No.: 17/390,645

(22) Filed: Jul. 30, 2021

(65) Prior Publication Data
US 2023/0035791 A1 Feb. 2, 2023

(51) Int. Cl.
*H01L 29/78* (2006.01)
*H01L 21/8234* (2006.01)
*H01L 29/06* (2006.01)
*H01L 29/423* (2006.01)
(Continued)

(52) U.S. Cl.
CPC .. *H01L 29/7851* (2013.01); *H01L 21/823418* (2013.01); *H01L 21/823431* (2013.01); *H01L 21/823468* (2013.01); *H01L 29/0673* (2013.01); *H01L 29/42392* (2013.01);
(Continued)

(58) Field of Classification Search
CPC ......... H01L 21/02603; H01L 21/28141; H01L 21/823418; H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/41791; H01L 29/42392; H01L 29/66439; H01L 29/6653; H01L 29/66545; H01L 29/66553; H01L 29/6656; H01L 29/66636; H01L 29/66795; H01L 29/7848; H01L 29/775; H01L 29/785; H01L 29/7851; H01L 29/7853; H01L 29/7855; H01L 29/78618; H01L 2029/7858
See application file for complete search history.

(56) References Cited

U.S. PATENT DOCUMENTS 9,209,247 B2    12/2015  Colinge et al.
9,236,267 B2    1/2016   De et al.
9,412,817 B2    8/2016   Yang et al.
(Continued)

*Primary Examiner* — David C Spalla
(74) *Attorney, Agent, or Firm* — Birch, Stewart, Kolasch & Birch, LLP

(57) ABSTRACT

A semiconductor device structure includes a fin structure formed over a substrate. The structure also includes nanostructures formed over the fin structure. The structure also includes a gate structure wrapped around the nanostructures. The structure also includes a first inner spacer formed beside the gate structure. The structure also includes a second inner spacer formed beside the first inner spacer. The structure also includes spacer layers formed over opposite sides of the gate structure above the nanostructures. The structure also includes source/drain epitaxial structures formed over opposite sides of the fin structure. The second inner spacer is partially embedded in the source/drain epitaxial structures.

20 Claims, 13 Drawing Sheets

(51) Int. Cl.
   *H01L 29/66* (2006.01)
   *H01L 29/786* (2006.01)
(52) U.S. Cl.
   CPC .... *H01L 29/66545* (2013.01); *H01L 29/6656* (2013.01); *H01L 29/66795* (2013.01); *H01L 29/78618* (2013.01)

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0250261 A1* | 8/2017 | Kim .................. H01L 29/78696 |
| 2018/0358435 A1* | 12/2018 | Mochizuki .......... H01L 29/0673 |

* cited by examiner

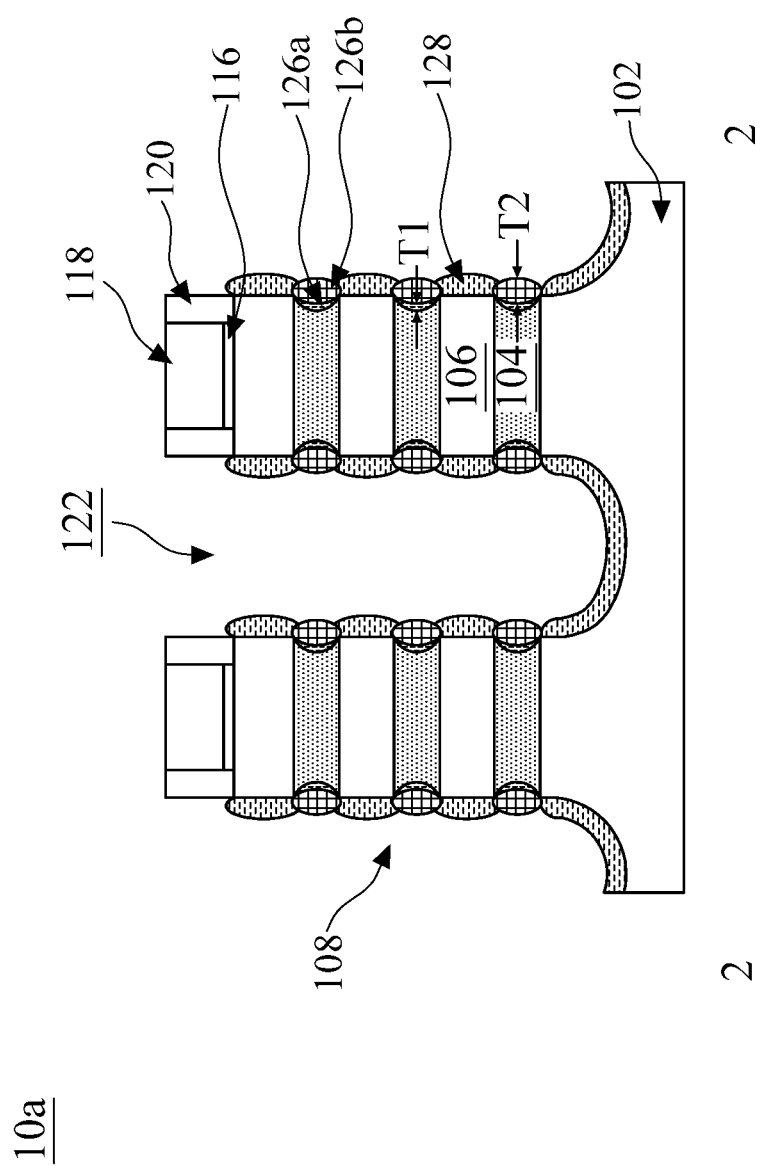

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2F are cross-sectional representations of various stages of forming a semiconductor device structure, in accordance with some embodiments of the disclosure.

DETAILED DESCRIPTION

Figure 1:
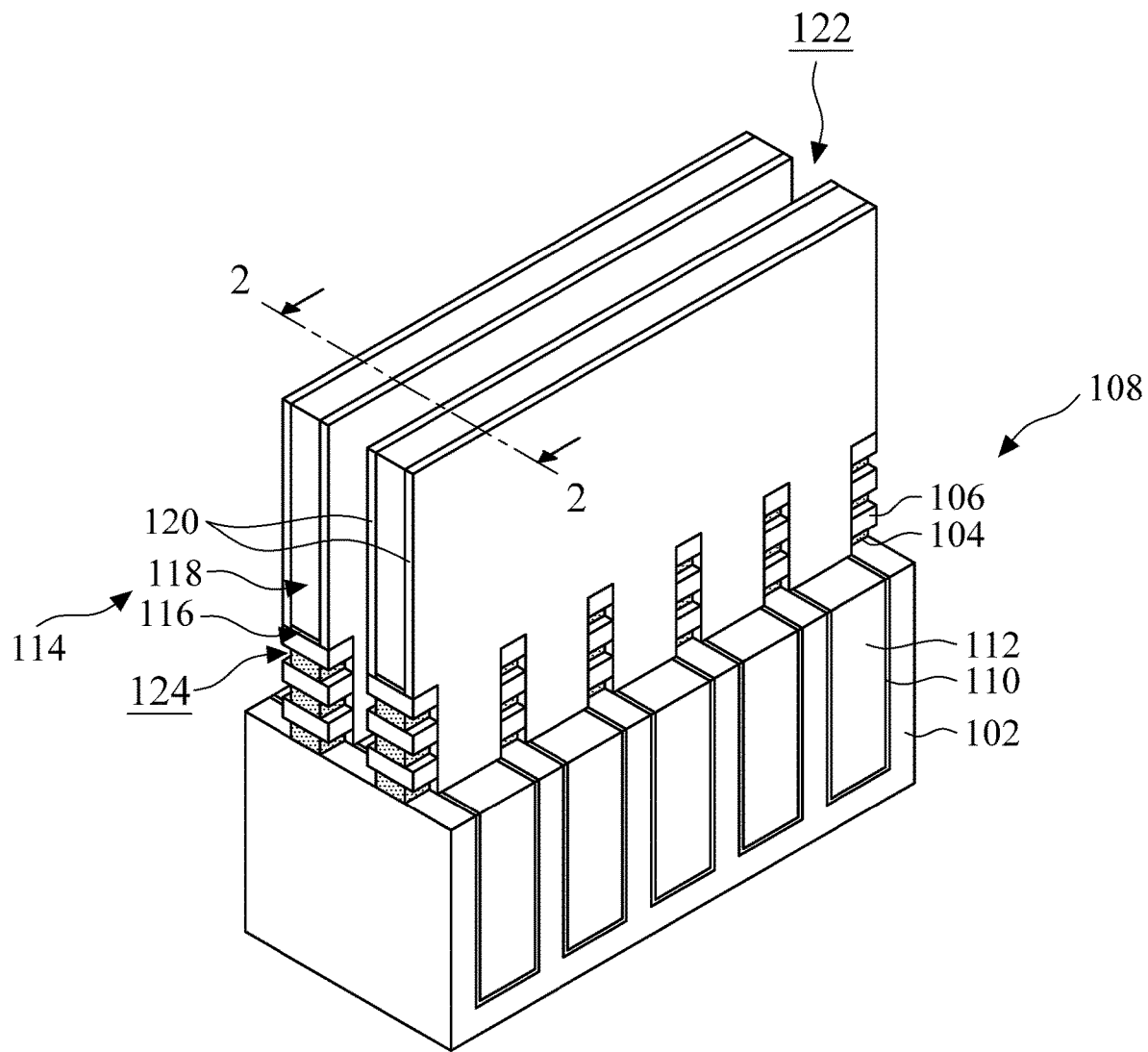
FIG. 1 is a perspective representation of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor device structure are provided. The method for forming the semiconductor device structure may include forming an inner spacer partially embedding in the source/drain epitaxial structures. With the inner spacer extending out from the sidewall of the fin structure, the inner spacer may be thicker. Therefore, the parasitic capacitance may be decreased, and the leakage current between metal gate layers and the source/drain epitaxial structures may also be reduced.

FIG. 1 is a perspective representation of a semiconductor device structure 10a, in accordance with some embodiments of the disclosure. The semiconductor device structure 10a is a gate all around (GAA) transistor structure. FIGS. 2A-2F are cross-sectional representations of various stages of forming the semiconductor device structure 10a, in accordance with some embodiments of the disclosure. FIGS. 2A-2F show cross-sectional representations taken along line 2-2 in FIG. 1.

Figure 2A:
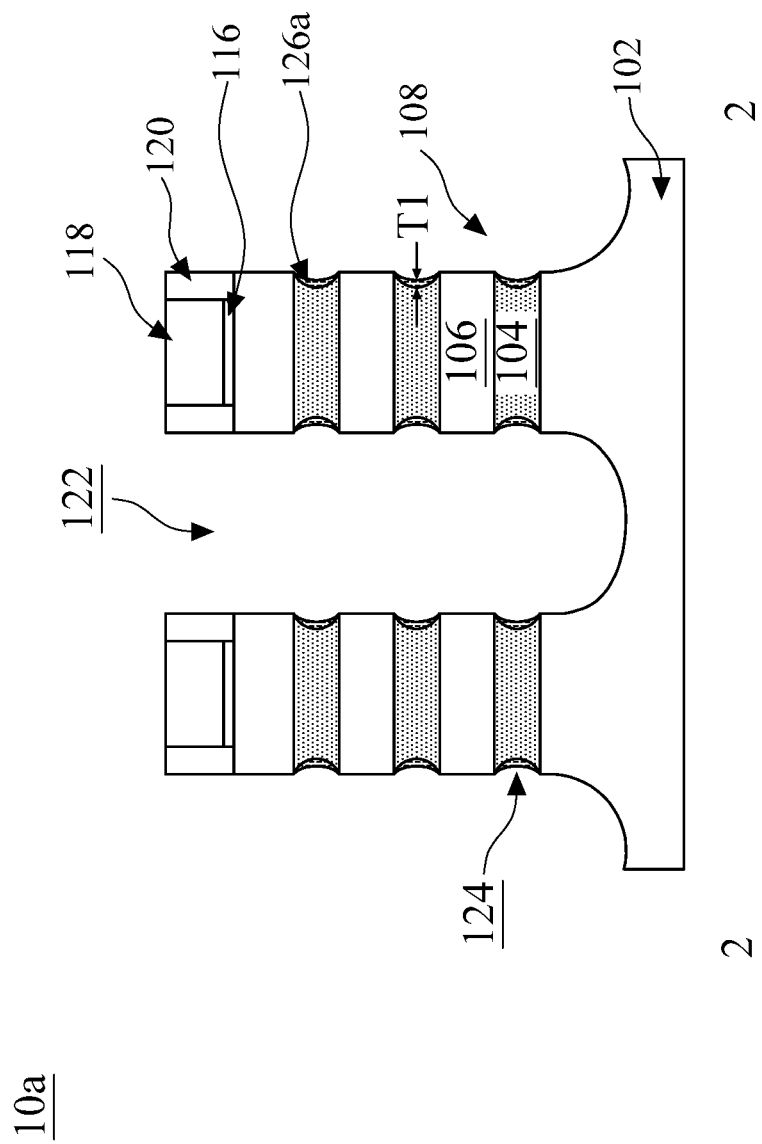

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor layers 104 and second semiconductor layers 106 are alternating stacked over the substrate 102. The first semiconductor layers 104 and the second semiconductor layers 106 may include Si, Ge, SiGe, GaAs, InSb, GaP, GaSb, InAlAs, InGaAs, GaSbP, GaAsSb, or InP. The first semiconductor layers 104 and second semiconductor layers 106 may be made of different materials with different etching rates. In some embodiments, the first semiconductor layers 104 are SiGe and the second semiconductor layers 106 are Si.

The first semiconductor layers 104 and second semiconductor layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor layers 104 and three layers of the second semiconductor layers 106 shown in FIGS. 1 and 2A, the number of the first semiconductor layers 104 and second semiconductor layers 106 are not limited herein, depending on the demand of performance and process.

Next, a hard mask layer may be formed and patterned over the first semiconductor layers 104 and second semiconductor layers 106 (not shown). The first semiconductor layers 104 and second semiconductor layers 106 may be patterned to form fin structures 108 using the patterned hard mask layer as a mask layer. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 108 are formed, a liner layer 110 is formed in the trenches between the fin structures 108, as shown in FIG. 1 in accordance with some embodiments. The liner layer 110 may be conformally formed over the substrate 102, the fin structure 108, and the hard mask layer covering the fin structure. The liner layer 110 may be used to protect the fin structure 108 from being damaged in the following processes (such as an anneal process or an etching process). In some embodiments, the liner layer is made of silicon nitride. The liner layer 110 may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 112 may be then filled over the liner layer 110 in the trenches between the fin structures 108. The isolation structure 112 may be made of silicon oxide, silicon nitride, silicon oxynitride, fluoride-doped silicate glass (FSG), or another low-k dielectric material. The isolation structure 112 may be deposited by a deposition process, such as a chemical vapor deposition (CVD) process, a spin-on-glass process, or another applicable process.

Next, an etching process may be performed on the isolation structure 112 and the liner layer 110. The etching process may be used to remove a top portion of the liner layer 110 and a top portion of the isolation structure 112. As a result, the first semiconductor layers 104 and the second semiconductor layers 106 may be exposed and the remaining isolation structure 112 and the liner layer 110 may surround the base portion of the fin structure 108. The remaining isolation structure 112 may be a shallow trench isolation (STI) structure surrounding the base portion of the fin structure 108. The isolation structure 112 may be configured to prevent electrical interference or crosstalk. Therefore, trenches may be formed between the fin structures 108.

Next, a dummy gate structure 114 is formed over and across the fin structures 108, as shown in FIGS. 1 and 2A in accordance with some embodiments. The dummy gate structure 114 may include a dummy gate dielectric layer 116 and a dummy gate electrode layer 118. The dummy gate dielectric layer 116 and the dummy gate electrode layer 118 may be replaced by the following steps to form a real gate structure with a high-k dielectric layer and a metal gate electrode layer.

The dummy gate dielectric layer 116 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 116 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfSiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 118 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The dummy gate electrode layer 118 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer 116 and the dummy gate electrode layer 118 to form the dummy gate structure 114 by using a patterned photoresist layer as a mask (not shown). The etching process may be a dry etching process or a wet etching process. The dummy gate dielectric layer 116 and a dummy gate electrode layer 118 may be etched by a dry etching process. The dry etching process may include using a fluorine-based etchant gas, such as $SF_6$, $C_xF_y$ (where x and y may be positive integers), $NF_3$, or a combination thereof. After the etching process, the first semiconductor layers 104 and the second semiconductor layers 106 may be exposed on opposite sides of the dummy gate structure 114.

Next, a pair of spacer layers 120 is formed on opposite sidewalls of the dummy gate structure 114, as shown in FIGS. 1 and 2A in accordance with some embodiments. The spacer layers 120 may be made of silicon oxide, silicon nitride, silicon oxynitride, and/or dielectric materials. The spacer layers 120 may be formed by a chemical vapor deposition (CVD) process, a spin-on-glass process, or another applicable process.

Afterwards, the first semiconductor layers 104 and the second semiconductor layers 106 of the fin structure 108 exposed on opposite sides of the dummy gate structure 114 may be removed in an etching process to form a source/drain opening 122, as shown in FIGS. 1 and 2A in accordance with some embodiments. The etching process may be a dry etching process or a wet etching process. The fin structures 108 may be etched by a dry etching process. The dry etching process may include using a fluorine-based etchant gas, such as $SF_6$, $C_xF_y$ (where x and y may be positive integers), $NF_3$, or a combination thereof.

Next, the first semiconductor layers 104 are laterally etched from the source/drain opening 122 to form recesses 124, as shown in FIGS. 1 and 2A in accordance with some embodiments. The outer portions of the first semiconductor layers 104 may be removed, and the inner portions of the first semiconductor layers 104 under the dummy gate structures 114 or the spacer layers 120 may remain. The lateral etching of the first semiconductor layers 104 may be a dry etching process, a wet etching process, or a combination thereof. After the lateral etching, the sidewalls of the etched first semiconductor layers 104 may be not aligned with the sidewalls of the second semiconductor layers 106. The etched first semiconductor layers 104 may have straight sidewalls or curved sidewalls, depending on the etching process.

Next, a first inner spacer 126a is formed in the recess 124, as shown in FIG. 2A in accordance with some embodiments. The first inner spacer 126a may provide a barrier between subsequently formed source/drain epitaxial structures and gate structure. The first inner spacer 126a may be made of silicon oxide, silicon nitride, silicon carbon nitride (SiCN), silicon oxide carbonitride (SiOCN), or a combination thereof. The first inner spacer 126a may be formed by a deposition process and an etch-back process. The deposition process may include a CVD process (such as LPCVD, PECVD, SACVD, or FCVD), an ALD process, another applicable method, or a combination thereof. The etch-back process may include a dry etching process or a wet etching process.

In some embodiments as shown in FIG. 2A, the first inner spacer 126a has a crescent shape. In some embodiments as shown in FIG. 2A, the first inner spacer 126a is laterally recessed from a sidewall of the second semiconductor layers 106.

The thickness of the first inner spacer 126a may depend on the etching amount of the first semiconductor layers 104. In some embodiments as shown in FIG. 2A, the first inner spacer 126a has a thickness T1 in a range of about 1 nm to about 3 nm. If the first inner spacer 126a is too thick, the first inner spacer 126a may also be formed on the second semiconductor layers 106. Therefore, the current path may be blocked. If the first inner spacer 126a is too thin, there may be leakage current between subsequently formed source/drain epitaxial structures and gate structure.

Figure 2B:
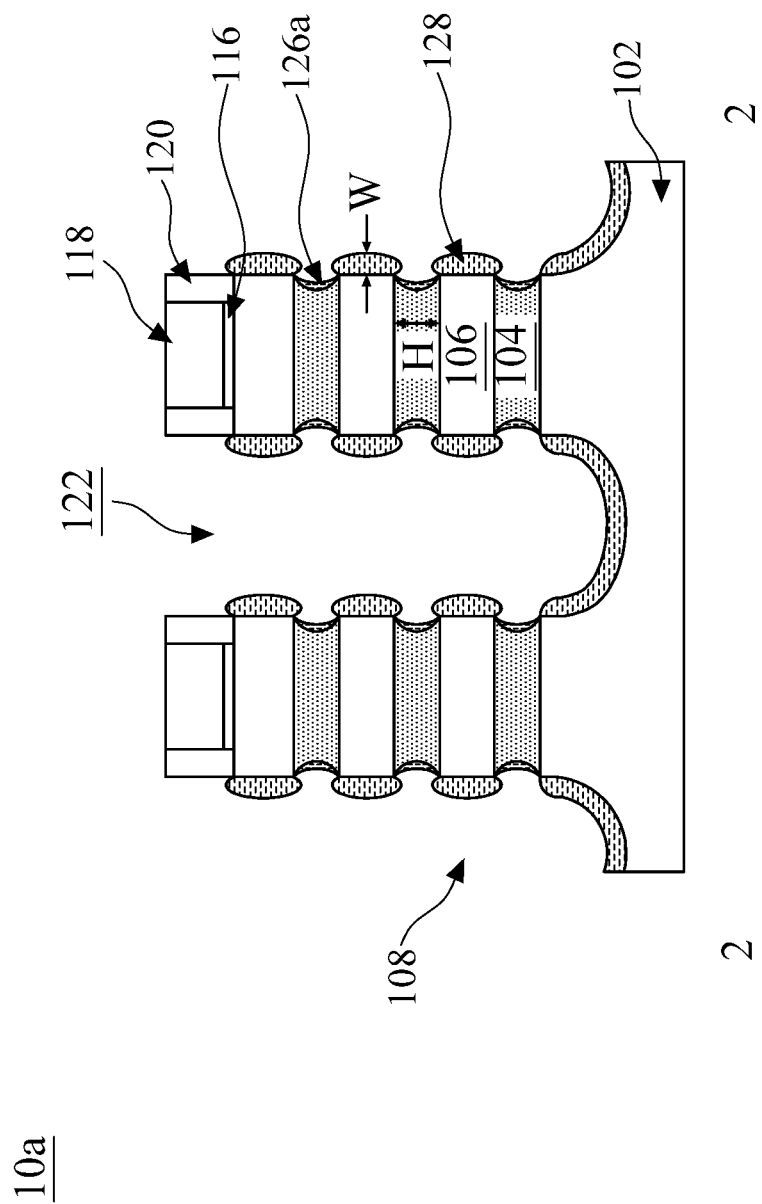

Next, a dummy layer 128 is grown over the sidewall of the second semiconductor layers 106, as shown in FIG. 2B in accordance with some embodiments. In addition, the dummy layer 128 is also grown over the substrate 102 between the fin structures 108, as shown in FIG. 2B in accordance with some embodiments. The dummy layer 128 may have growth selectivity over the surface of the second semiconductor layers 106 and the first inner spacer 126a. In some embodiments, the dummy layer 128 is grown only over the sidewall of the second semiconductor layers 106, but not over the sidewall of the first inner spacer 126a. In some embodiments, the dummy layer 128 is made of silicon. The dummy layer 128 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments as shown in FIG. 2B, the thickness W of the dummy layer 128 is in a range of about 2 nm to about 8 nm. In some embodiments as shown in FIG. 2B, the ratio of the thickness W of the dummy layer 128 to the thickness H of the first semiconductor layers 104 is in a range of about 0.2 to about 0.5. If the dummy layer 128 is too thick, the dummy layer 128 over sidewalls of different second semiconductor layers 106 may be merged, and it may be difficult to form subsequently formed inner spacer. If the dummy layer 128 is too thin, the subsequently formed inner spacer may be too thin, and there may be leakage between the subsequently formed source/drain epitaxial structures and gate structure.

Next, a second inner spacer 126b is selectively formed over the sidewall of the first inner spacer 126a, as shown in FIG. 2C in accordance with some embodiments. In some embodiments, the second inner spacer material 126b is formed over the sidewall of the first inner spacer 126a and the sidewall of the dummy layer 128 first, and the second inner spacer material 126b formed over the sidewall of the dummy layer 128 is removed later.

In some embodiments as shown in FIG. 2C, the sidewall of the dummy layer 128 is aligned with the sidewall of the second inner spacer 126b. If the second inner spacer 126b protrudes from the sidewall of the dummy layer 128, there may be dummy layer 128 residue in subsequent removing process, and the conductive current path may be blocked. If the second inner spacer 126b is recessed from the sidewall of the dummy layer 128, the parasitic capacitance may be increased.

The deposition process of depositing the second inner spacer material 126b may include a CVD process (such as LPCVD, PECVD, SACVD, or FCVD), an ALD process, other applicable processes, or a combination thereof. The excess second inner spacer material 126b may be etched by a dry etching process. The dry etching process may include using a fluorine-based etchant gas, such as $SF_6$, $C_xF_y$ (where x and y may be positive integers), NF$_3$, or a combination thereof. After the etching process, the dummy layer 128 may be exposed.

The second inner spacer 126b may be made of silicon oxide, silicon nitride, silicon carbon nitride (SiCN), silicon oxide carbonitride (SiOCN), or a combination thereof. In some embodiments, the second inner spacer 126b and the first inner spacer 126a are made of the same material. Material of the second inner spacer 126b may be chosen depending on the requirements of the capacitance.

In some embodiments as shown in FIG. 2C, the ratio of the thickness T2 of the second inner spacer 126b to the thickness T1 of the first inner spacer 126a is in a range of about 1.5 to about 5. If the ratio of thickness T2 to thickness T1 is too great, the overlap part between subsequently formed source/drain epitaxial structures and the gate structure may be too great, and the resistance may be increased. If the ratio of thickness T2 to thickness T1 is too low, there may be leakage current between subsequently formed source/drain epitaxial structures and the gate structure and the parasitic capacitance may be increased.

Figure 2D:
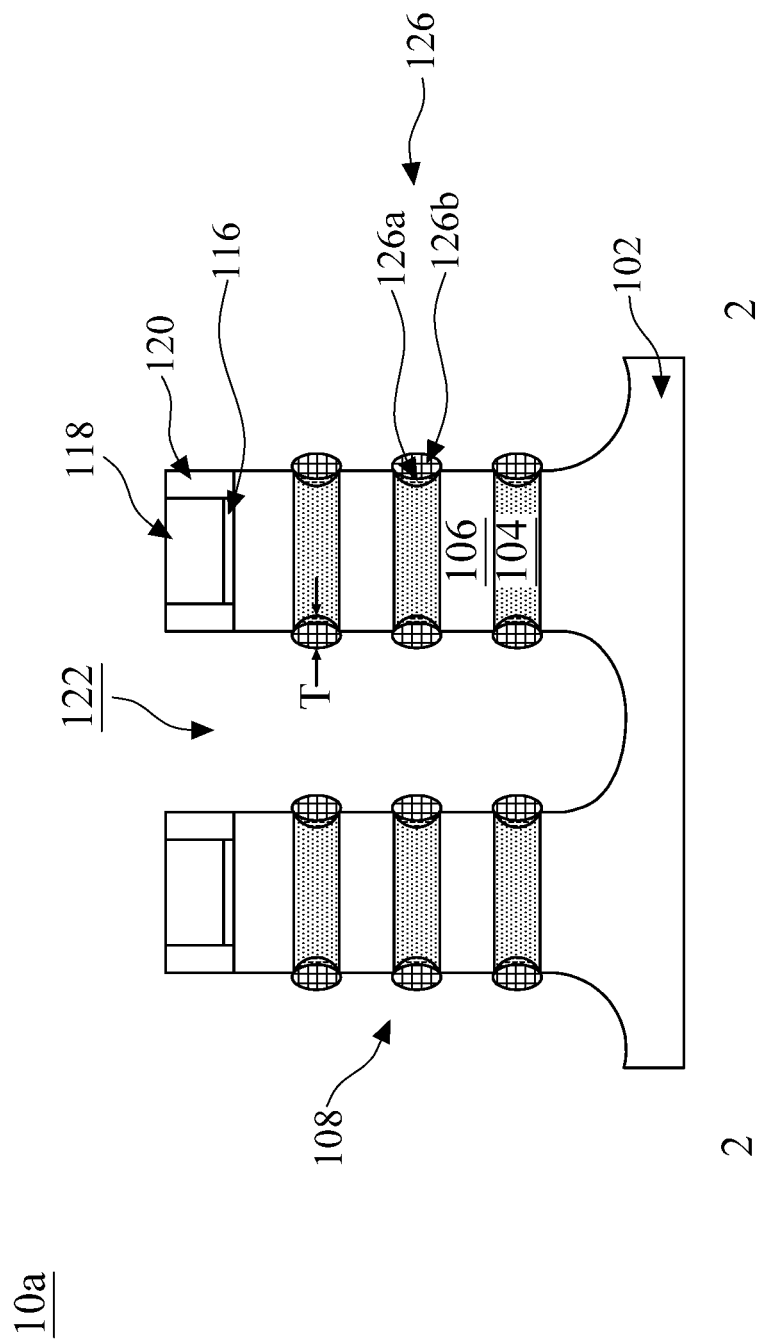

After the second inner spacer 126b is formed, the dummy layer 128 is removed and the second semiconductor layers 106 is exposed, as shown in FIG. 2D in accordance with some embodiments. In addition, the substrate 102 between the fin structures 108 is also exposed. Therefore, the second inner spacer 126b laterally extends protruding from a sidewall of the second semiconductor layers 106, as shown in FIG. 2D in accordance with some embodiments. The first inner spacer 126a and the second inner spacer 126b may be regarded as an inner spacer 126. In some embodiments as shown in FIG. 2D, the width of the middle portion of the inner spacer 126 is wider than the width of the top portion of the inner spacer 126. In some embodiments as shown in FIG. 2D, the second inner spacer 126 partially overlaps the spacer layer 120 in a top view.

With the second inner spacer 126b formed over the sidewall of the first inner spacer 126a, the inner spacer 126 protrudes from the sidewall of the fin structure 108. Thicker inner spacer 126 may improve the parasitic capacitance, and reduce the leakage current between the subsequently formed source/drain epitaxial structure and the gate structure.

In some embodiments as shown in FIG. 2D, the minimum width T of the inner spacer 126 is in a range of about 2 nm to about 8 nm. If the inner spacer 126 is too wide, the overlap part between subsequently formed source/drain epitaxial structures and the gate structure may be too great, and the resistance may be increased. If the inner spacer 126 is too thin, there may be leakage between the subsequently formed source/drain epitaxial structure and the gate structure.

Figure 2E:
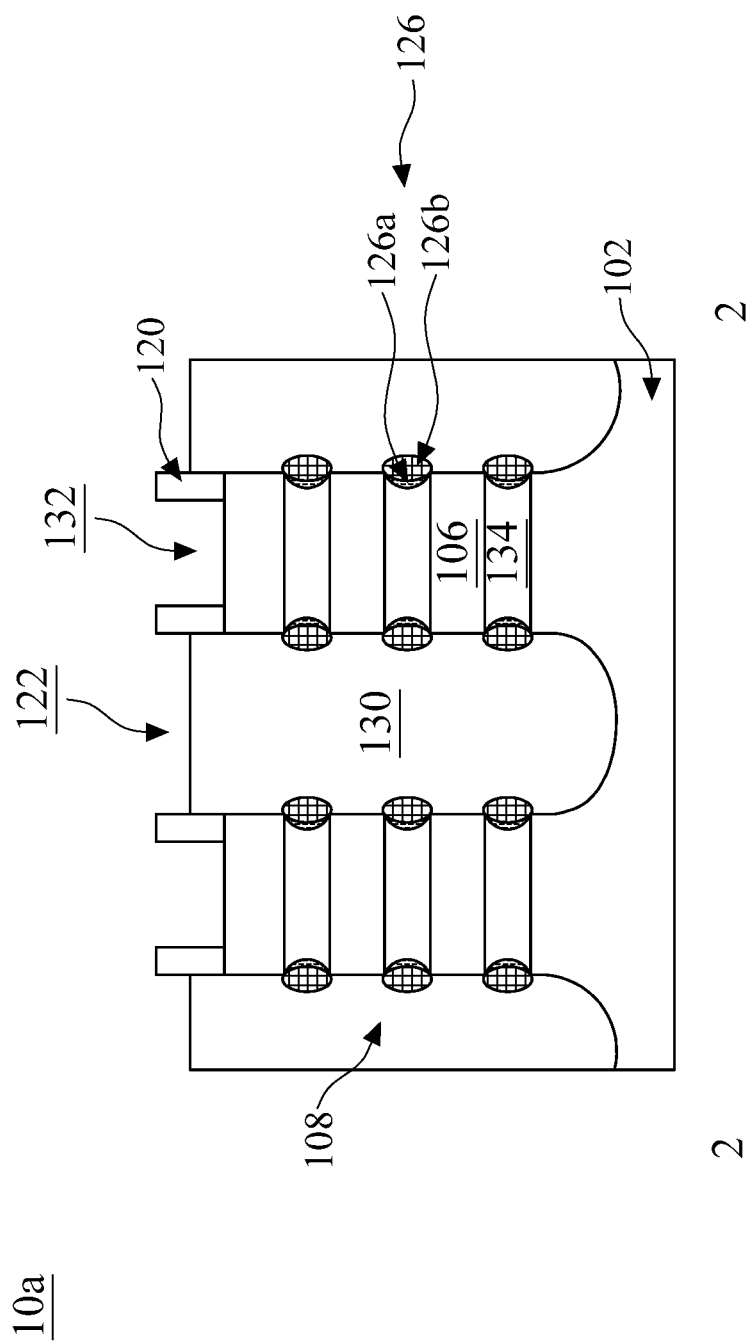

Next, a source/drain epitaxial structure 130 is formed in the source/drain opening 122, as shown in FIG. 2E in accordance with some embodiments. As shown in FIG. 2E, the source/drain epitaxial structure 130 is formed over opposite sides of the fin structure 108.

A strained material may be grown in the source/drain opening 122 by an epitaxial (epi) process to form the source/drain epitaxial structure 130. In addition, the lattice constant of the strained material may be different from the lattice constant of the substrate 102. The source/drain epitaxial structure 130 may include Ge, SiGe, InAs, InGaAs, InSb, GaAs, GaSb, InAlP, InP, SiC, SiP, other applicable materials, or a combination thereof. The source/drain epitaxial structure 130 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. The source/drain epitaxial structure 130 may be doped with one or more dopants. For example, source/drain epitaxial structure 130 may be silicon germanium (SiGe) doped with boron (B) or another applicable dopant.

After forming the source/drain epitaxial structure 130, the second inner spacer 126b is partially embedded in the source/drain epitaxial structure 130, as shown in FIG. 2E in accordance with some embodiments. In some embodiments as shown in FIG. 2E, the first inner spacer 126a and the source/drain epitaxial structure 130 are separated by the second inner spacer 126b. As shown in FIG. 2E, the source/drain epitaxial structure 130 partially covers the sidewall of the spacer layers 120 and an upper portion of the spacer layers 120 is exposed from the source/drain opening 122.

Next, an etch stop layer is formed over the source/drain epitaxial structure 130 (not shown). The etch stop layer may include silicon nitride, silicon oxide, silicon oxynitride (SiON), other applicable materials, or a combination thereof. The etch stop layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the source/drain epitaxial structure 130 is formed, an inter-layer dielectric (ILD) structure is formed over the etch stop layer (not shown). The ILD structure may include multilayers made of multiple dielectric materials, such as silicon oxide (SiO$_x$, where x may be a positive integer), silicon oxycarbide (SiCO$_y$, where y may be a positive integer), silicon oxycarbonitride (SiNCO$_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure may be formed by chemical vapor deposition (CVD), spin-on coating, or other applicable processes.

Afterwards, a planarizing process is performed on the ILD structure until the top surface of the dummy gate structure 114 is exposed (not shown). After the planarizing process, the top surface of the dummy gate structure 114 may be substantially level with the top surfaces of the spacer layers 120 and the ILD structure. The planarizing process may include a grinding process, a chemical mechanical polishing (CMP) process, an etching process, other applicable processes, or a combination thereof.

Next, the dummy gate structure 114 including the dummy gate dielectric layer 116 and a dummy gate electrode layer 118 is removed, as shown in FIG. 2E in accordance with some embodiments. Therefore, a trench 132 is formed between the spacer layers 120 over the fin structure 108 and the second semiconductor layers 106 are exposed from the trench 132. The dummy gate structure 114 may be removed by a dry etching process or a wet etching process.

After the trenches 132 are formed, the first semiconductor layers 104 are removed to form gaps 134, as shown in FIG. 2E in accordance with some embodiments. The removal process may include a selective etching process. The selective etching process may remove the first semiconductor layers 104 and remain the second semiconductor layers 106 as a nanostructure 106 as a channel region of the semiconductor device structure 10a, in accordance with some embodiments.

The selective etching process of removing the first semiconductor layers 104 may include a wet etch process, a dry etch process, or a combination thereof. The selective etching process may be a plasma-free dry chemical etching process. The etchant of the dry chemical etching process may include radicals such as HF, $NF_3$, $NH_3$, $H_2$, or a combination thereof.

Figure 2F:
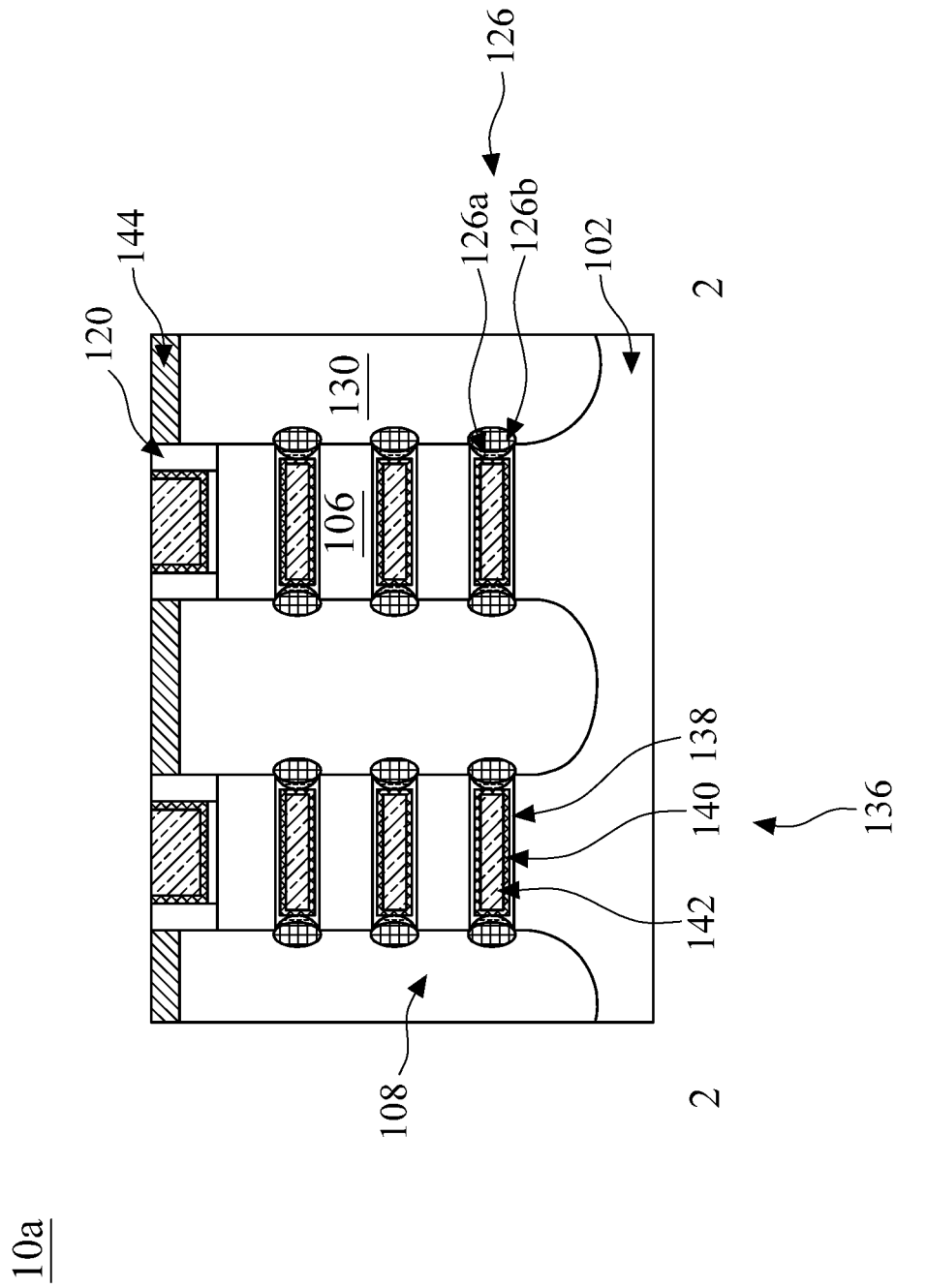

After the gaps 134 are formed, gate structures 136 are formed surrounding the nanostructure 106, as shown in FIG. 2F in accordance with some embodiments. The gate structures 136 may be multi-layered structures. Each of the gate structures 136 may include an interfacial layer 138, a high-k dielectric layer 140, a work function layer 142, and a gate electrode layer (not shown). The nanostructure 106 may be surrounded and in direct contact with the interfacial layers 138, and the interfacial layers 138 may be surrounded by the high-k dielectric layers 140. In addition, the high-k dielectric layers 140 may be surrounded by the work function layer 142, and the work function layer 142 may be surrounded by the gate electrode layer.

The interfacial layers 138 may be made of silicon oxide, and the interfacial layers 138 may be formed by thermal oxidation. The high-k dielectric layer 140 may include dielectric material, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other applicable high-k dielectric materials, or a combination thereof. The high-k dielectric layers 140 may be formed by using CVD, ALD, other applicable methods, or a combination thereof.

The work function layers 142 may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The P-work-function metal may include titanium nitride (TiN), tungsten nitride (WN), tantalum nitride (TaN), ruthenium (Ru) or a combination thereof. The work function layers 142 may be formed by using CVD, ALD, other applicable methods, or a combination thereof.

The gate electrode layers may be made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another applicable material, or a combination thereof. The gate electrode layers may be formed by using CVD, ALD, electroplating, another applicable method, or a combination thereof.

As shown in FIG. 2F, the gate structure 136 surrounds the nanostructure 106, which may enhance gate control ability. In addition, the boundary between the first inner spacer 126a and the gate structure 136 is under the spacer layers 120, as shown in FIG. 2F in accordance with some embodiments.

Next, a metal semiconductor compound layer may be formed over the source/drain epitaxial structure 130 (not shown). The metal semiconductor compound layer may reduce the contact resistance between the source/drain epitaxial structure 130 and the subsequently formed contact structure over the source/drain epitaxial structure 130. The metal semiconductor compound layer may be made of titanium silicide ($TiSi_2$), nickel silicide (NiSi), cobalt silicide (CoSi), or other suitable low-resistance materials. The metal semiconductor compound layer may be formed over the source/drain epitaxial structure 130 by forming a metal layer over the source/drain epitaxial structure 130 first. The metal layer may react with the source/drain epitaxial structure 130 in an annealing process and a metal semiconductor compound layer may be produced. Afterwards, the unreacted metal layer may be removed in an etching process and the metal semiconductor compound layer may be left.

Next, a barrier layer may be conformally formed over the bottom surface and the sidewalls of the source/drain opening 122 (not shown). Afterwards, the barrier layer may be etched back. The barrier layer remains over the bottom surface of the source/drain opening 122. The barrier layer may be formed before filling the conductive material in the source/drain opening 122 to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a contact structure 144 is formed into the source/drain opening 122 over the source/drain epitaxial structure 130, as shown in FIG. 2F in accordance with some embodiments. The contact structure 144 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 144 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 144, and then a planarization process such as a chemical mechanical polishing (CMP) process or an etch back process is optionally performed to remove excess conductive materials. After the planarization process, the top surface of the contact structure 144 may be level with the top surface of gate structure 136 and the spacer layers 120.

In some embodiments as shown in FIG. 2F, since the second inner spacer 126b laterally protrudes from the sidewall of the fin structure 108, the inner spacer 126 overlaps the contact structure 144 in a top view.

With a second inner spacer 126b formed over the sidewall of the first inner spacer 126a, the inner spacer 126 laterally protrudes from a sidewall of the nanostructures 106, and the inner spacer 126 is thicker. The thicker inner spacer 126 may reduce the parasitic capacitance and the leakage current between the gate structure 136 and the source/drain epitaxial structure 130.

Figure 3A:
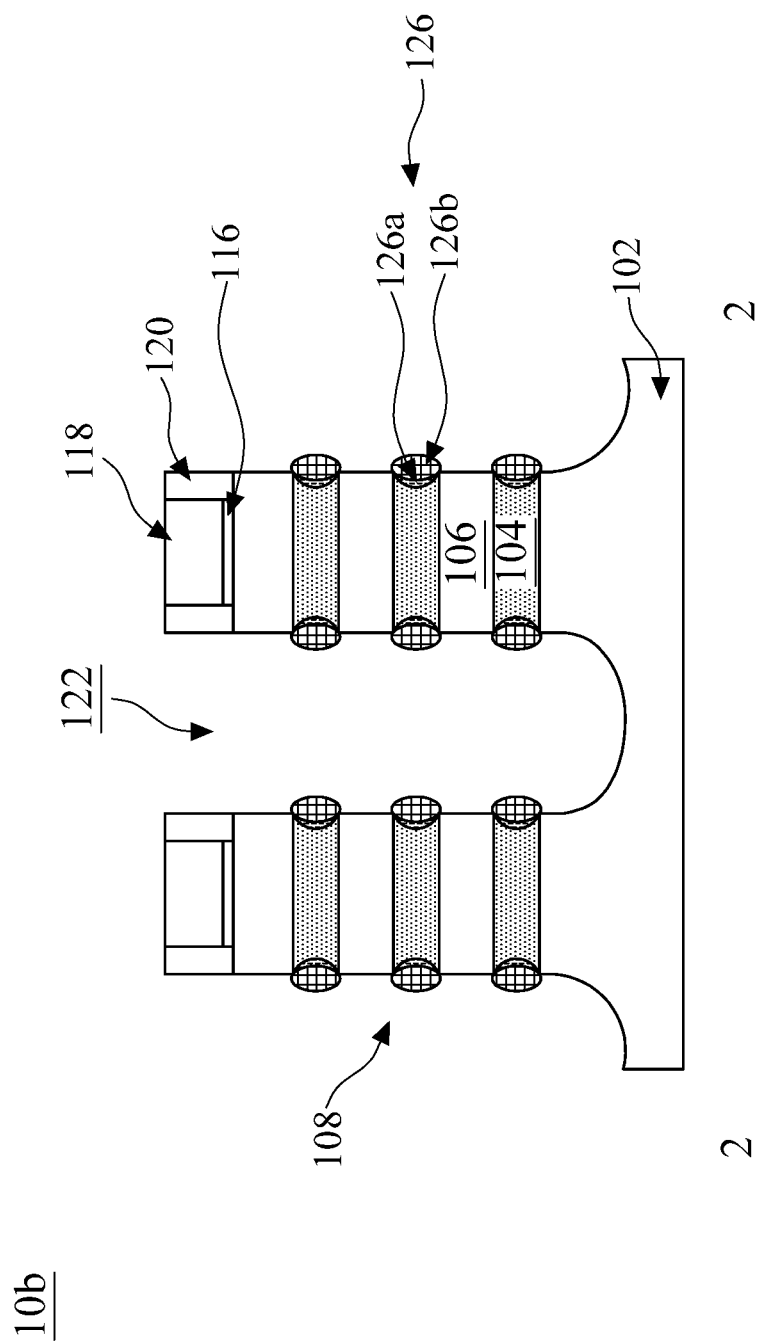
FIGS. 3A-3B are cross-sectional representations of various stages of forming a semiconductor device structure, in accordance with some embodiments of the disclosure.
Figure 3B:
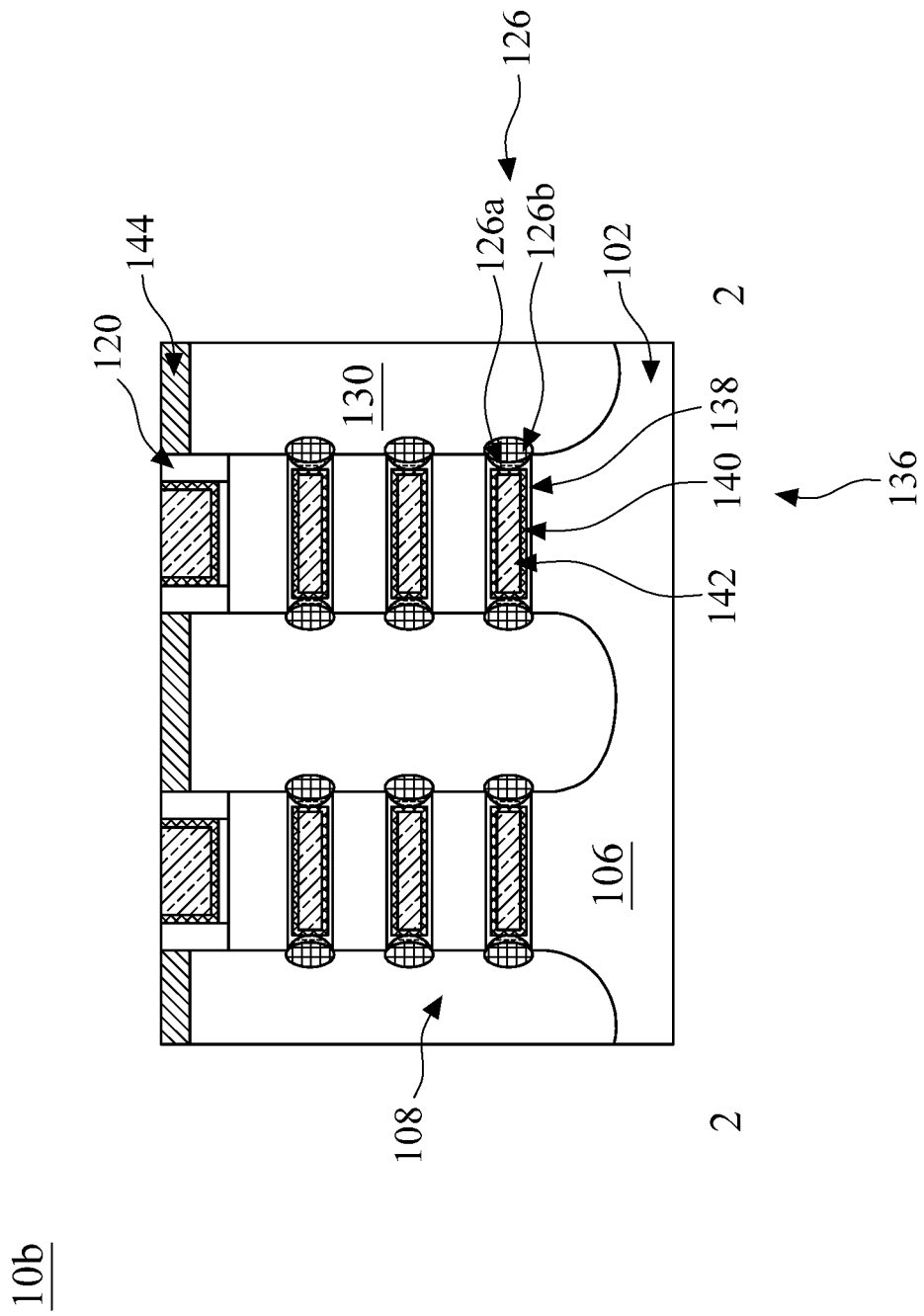

Many variations and/or modifications may be made to the embodiments of the disclosure. FIGS. 3A-3B are cross-sectional representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3A in accordance with some embodiments, the second inner spacer 126b is formed without forming the dummy layer 128.

After the first inner spacer 126a is formed, the second inner spacer 126b is selectively deposited over the sidewall of the first inner spacer 126a, as shown in FIG. 3A in accordance with some embodiments. In some embodiments, the second inner spacer 126b is deposited over the sidewall of the first inner spacer 126a, but not over the sidewall of the second semiconductor layers 106. In some embodiments, the first inner spacer 126a and the second inner spacer 126b are made of different materials. In some embodiments, the first inner spacer 126a includes silicon oxide, and the second inner spacer 126b includes silicon nitride.

The second inner spacer material 126b may be formed over the sidewall of the first inner spacer 126a and the sidewall of the second semiconductor layers 106 first. Afterwards, a cleaning process is performed over the second inner spacer material 126b. The second inner spacer material 126b over the sidewall of the second semiconductor layers 106 may be removed. Therefore, the sidewall of the second semiconductor layers 106 may be exposed, and the inner spacer 126 including the first inner spacer 126a and the second inner spacer 126b may laterally extend protruding from the sidewall of the second semiconductor layers 106. Therefore, the inner spacer 126 may be wider.

In other words, the inner spacer 126 may be formed by two-steps. The first inner spacer material 126a/126b may be formed over the sidewall of the laterally etched first semiconductor layers 104 and the second semiconductor layers 106. Afterwards, the inner spacer material 126b over the second semiconductor layers 106 is removed.

The deposition process of depositing the second inner spacer material 126b may include a CVD process (such as LPCVD, PECVD, SACVD, or FCVD), an ALD process, other applicable process, or a combination thereof. The cleaning process removing the excess second inner spacer material 126b over the sidewall of the second semiconductor layers 106 may be a dry etching process or a wet etching process, and/or other suitable etching processes. The dry etching process may be performed by an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), bromine-containing gas (such as HBr and/or $CHBR_3$), iodine-containing gas, other suitable gas and/or plasma, or a combination thereof. The wet etching process may be performed in wet etching etchant including diluted hydrofluoric acid (DHF), potassium hydroxide (KOH), ammonia, hydrofluoric acid (HF), nitric acid ($HNO_3$), and/or acetic acid ($CH_3COOH$), other suitable wet etching etchant, or a combination thereof.

Afterwards, the source/drain epitaxial structure 130 is formed in the source/drain opening 122, and the gate structure 136 is formed surrounding the nanostructures 106. Contact structures 144 are also formed over the source/drain epitaxial structure 130, as shown in FIG. 3B in accordance with some embodiments. The processes and materials for forming the source/drain epitaxial structure 130, the gate structure 136, and the contact structure 144 may be the same as, or similar to, those used to form the source/drain epitaxial structure 130, the gate structure 136, and the contact structure 144 in the previous embodiments. For the purpose of brevity, the descriptions of these processes are not repeated herein.

With a second inner spacer 126b formed over the sidewall of the first inner spacer 126a, the inner spacer 126 laterally protrudes from the sidewall of the nanostructures 106, and the inner spacer 126 is thicker. The thicker inner spacer 126 may reduce the parasitic capacitance and the leakage current between the gate structure 136 and the source/drain epitaxial structure 130. The second inner spacer 126b may be selectively formed over the sidewall of the first inner spacer 126a. Therefore, the process cost and time may be saved.

Many variations and/or modifications may be made to the embodiments of the disclosure. FIGS. 4A-4D are cross-sectional representations of various stages of forming a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A in accordance with some embodiments, the second inner spacer 126b is formed over the sidewall of the spacer layer 120.

Figure 4A:
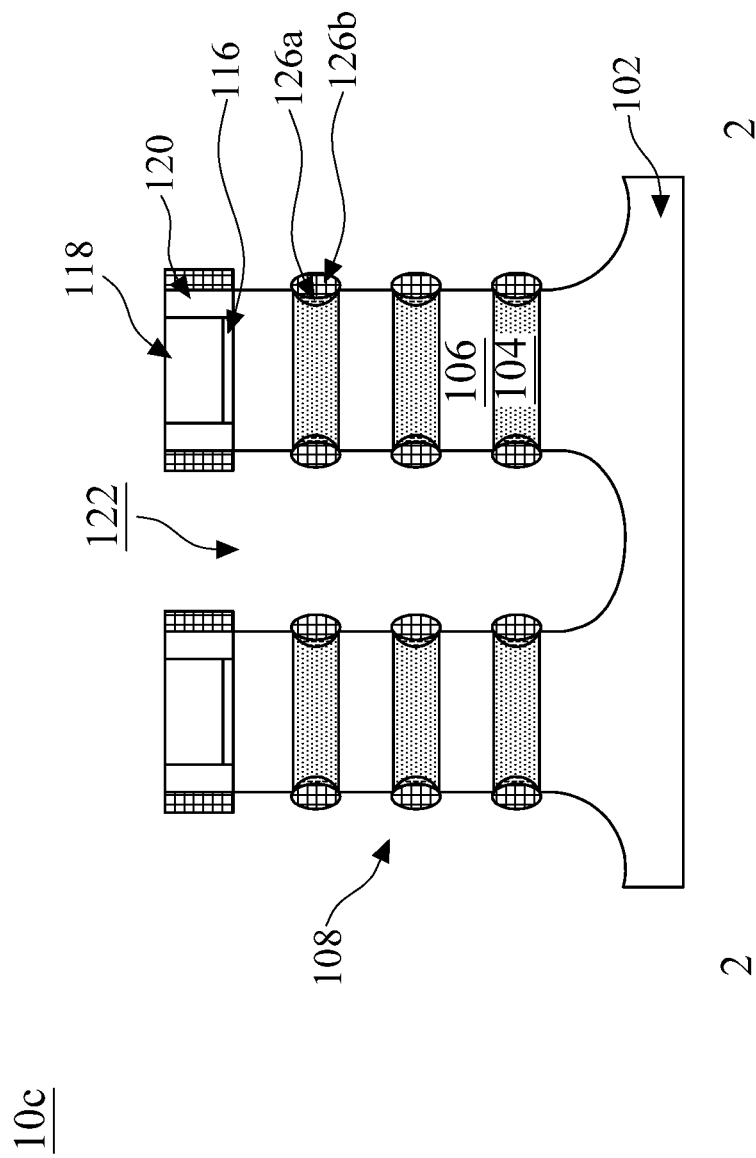
FIGS. 4A-4D are cross-sectional representations of various stages of forming a semiconductor device structure, in accordance with some embodiments of the disclosure.

After the first inner spacer 126a is formed, the second inner spacer 126b is selectively deposited over the sidewall of the first inner spacer 126a and the sidewall of the spacer layer 120, as shown in FIG. 4A in accordance with some embodiments. In some embodiments, the second inner spacer 126b is deposited over the sidewall of the first inner spacer 126a and the sidewall of the spacer layer 120, but not over the sidewall of the second semiconductor layers 106. In some embodiments, the first inner spacer 126a and the second inner spacer 126b are made of different materials. In some embodiments, the first inner spacer 126a and the spacer layer 120 includes silicon oxide, and the second inner spacer 126b includes silicon nitride.

After forming the second inner spacer material 126b, a clean process is performed to remove excess second inner spacer material 126b. The processes and materials for forming the second inner spacer 126b may be the same as, or similar to, those used to form second inner spacer 126b in the embodiment as shown in FIG. 3A. For the purpose of brevity, the descriptions of these processes are not repeated herein.

Figure 4B:
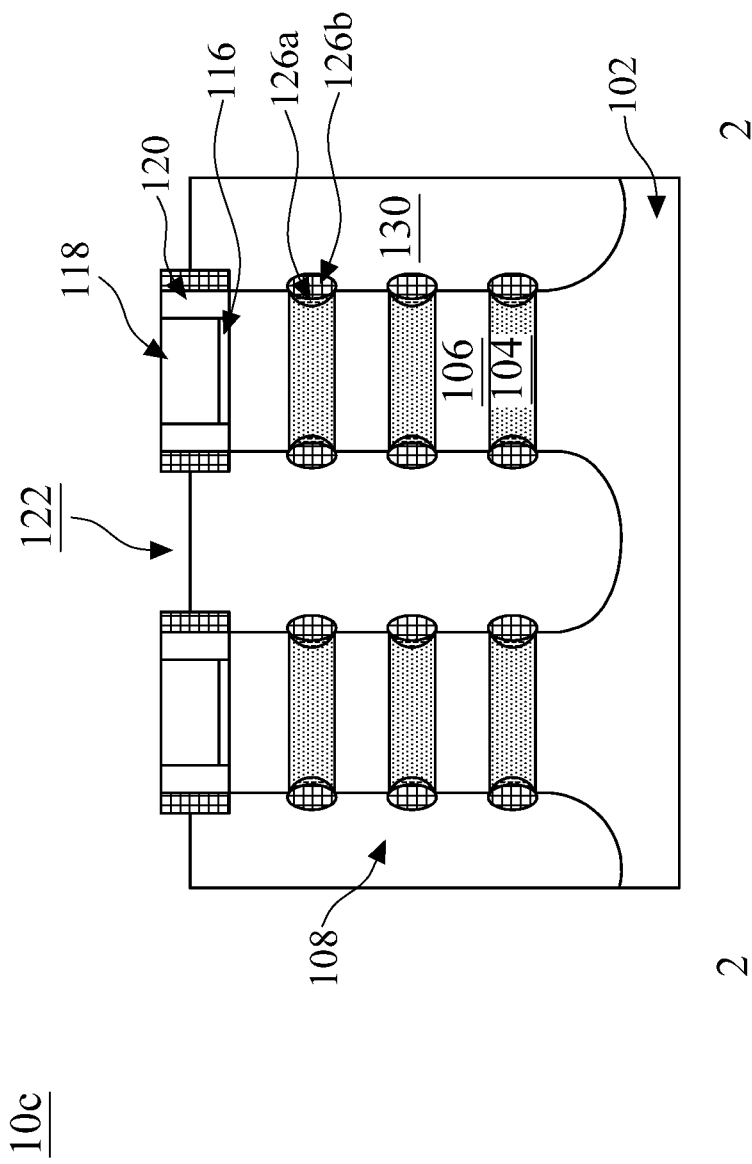

Afterwards, the source/drain epitaxial structure 130 is formed in the source/drain opening 122, as shown in FIG. 4B in accordance with some embodiments. The processes and materials for forming the source/drain epitaxial structure 130 may be the same as, or similar to, those used to form the source/drain epitaxial structure 130 in the previous embodiments. For the purpose of brevity, the descriptions of these processes are not repeated herein. After forming the source/drain epitaxial structure 130, a portion of the second inner spacer 126b formed over a portion of the spacer layers 120 is exposed from the source/drain openings 122, as shown in FIG. 4B in accordance with some embodiments.

Figure 4C:
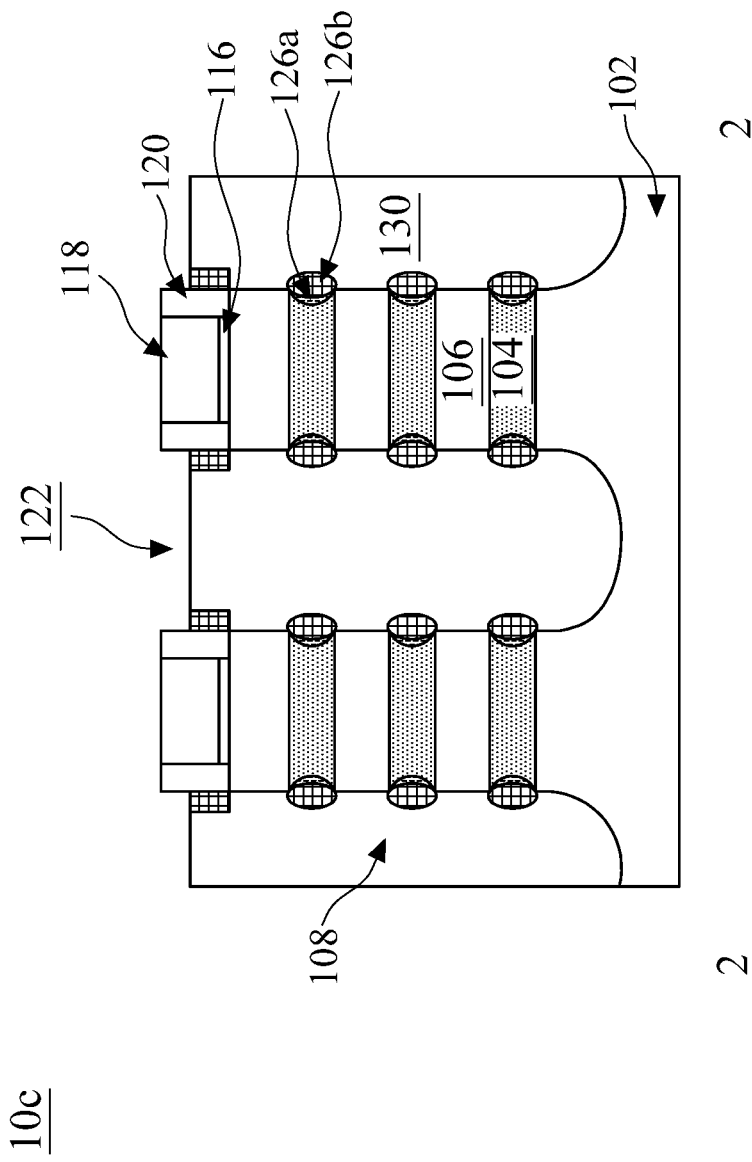

Next, an etching process is performed to remove the second inner spacer 126b exposed from the source/drain epitaxial structure 130, as shown in FIG. 4C in accordance with some embodiments. The etching process removing the second inner spacer 126b over the sidewall of the spacer layer 120 may be a dry etching process or a wet etching process. After removing the second inner spacer 126b exposed from the source/drain opening 122, the source/drain opening 122 is enlarged as shown in FIG. 4C. In addition, the second inner spacer 126b over the lower portion of the spacer layers 120 remains, as shown in FIG. 4C in accordance with some embodiments.

Figure 4D:
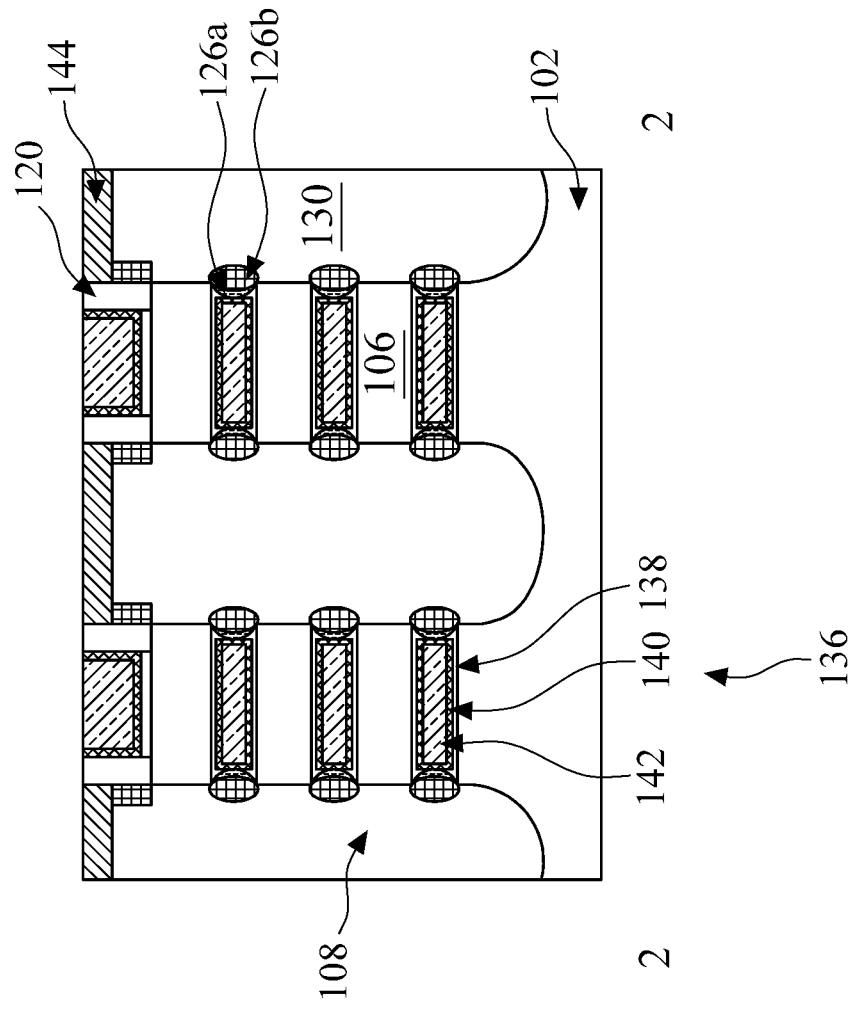

Afterwards, the gate structure 136 is formed surrounding the nanostructures 106 and the contact structure 144 are also formed over the source/drain epitaxial structure 130, as shown in FIG. 4D in accordance with some embodiments.

The processes and materials for forming the gate structure 13, and the contact structure 144 may be the same as, or similar to, those used to form the gate structure 136 and the contact structure 144 in the previous embodiments. For the purpose of brevity, the descriptions of these processes are not repeated herein.

Since the source/drain opening 122 is enlarged as shown in FIG. 4C, the contact structure 144 formed in the source/drain opening 122 may have a greater contact area and the resistance may be reduced.

With a second inner spacer 126b formed over the sidewall of the first inner spacer 126a, the inner spacer 126 laterally protrudes from a sidewall of the nanostructures 106, and the inner spacer 126 is thicker. Thicker inner spacer 126 may reduce the parasitic capacitance and the leakage current between the gate structure 136 and the source/drain epitaxial structure 130. The second inner spacer 126b may be selectively formed over the sidewall of the first inner spacer 126a and the spacer layer 120. Therefore, the process cost and time may be saved. By removing the second inner spacer 126b over the spacer 120 exposed from the source/drain epitaxial structure 130, the source/drain opening 122 may be enlarged, and the contact structure 144 formed therein may be enlarged. Therefore, the resistance may be lowered.

As described previously, the inner spacer 126 may be formed by a two-step process. The first inner spacer 126a may be recessed from the sidewall of the nanostructure 106 and the second inner spacer 126b may be protruding out from the sidewall of the nanostructure 106. The inner spacer 126 protruding out from the sidewall of the nanostructure 106 may reduce the parasitic capacitance and the leakage current. In some embodiments as shown in FIG. 3A, the second inner spacer 126b is selectively deposited over the sidewall of the first inner spacer 126a, and the process time and cost may be saved. In some embodiments as shown in FIG. 3A, the source/drain opening 122 is enlarged after selectively depositing the second inner spacer 126b, and the resistance may be further reduced.

Embodiments of a semiconductor device structure and a method for forming the same are provided. The method for forming the semiconductor device structure may include forming a laterally protruding inner spacer out from the fin structure. The inner spacer embedded in the source/drain epitaxial structures may be thicker. With thicker inner spacer, the parasitic capacitance and the leakage current may be reduced.

In some embodiments, a semiconductor device structure is provided. The semiconductor device structure includes a fin structure formed over a substrate. The semiconductor device structure further includes nanostructures formed over the fin structure. The semiconductor device structure further includes a gate structure wrapped around the nanostructures. The semiconductor device structure further includes a first inner spacer formed beside the gate structure. The semiconductor device structure further includes a second inner spacer formed beside the first inner spacer. The semiconductor device structure further includes spacer layers formed over opposite sides of the gate structure above the nanostructures. The semiconductor device structure further includes source/drain epitaxial structures formed over opposite sides of the fin structure. The second inner spacer is partially embedded in the source/drain epitaxial structures.

In some embodiments, a method for forming a semiconductor device structure is provided. The method for forming a semiconductor device structure includes forming a fin structure with alternating first semiconductor layers and second semiconductor layers stacked over a substrate. The method for forming a semiconductor device structure also includes forming a dummy gate structure across the fin structure. The method for forming a semiconductor device structure also includes forming spacer layers over opposite sides of the dummy gate structure. The method for forming a semiconductor device structure also includes forming source/drain openings in the fin structure beside the dummy gate structure. The method for forming a semiconductor device structure also includes laterally etching the first semiconductor layers from the source/drain openings. The method for forming a semiconductor device structure also includes depositing a first inner spacer over the sidewall of the first semiconductor layers. The method for forming a semiconductor device structure also includes depositing a second inner spacer over the sidewall of the first inner spacer. The method for forming a semiconductor device structure also includes growing source/drain epitaxial structures in the source/drain openings. The method for forming a semiconductor device structure also includes removing the dummy gate structure and the first semiconductor layers to form a gate opening between the second semiconductor layers. The method for forming a semiconductor device structure also includes forming a gate structure in the gate opening surrounding the second semiconductor layers. The second inner spacer laterally extends protruding from a sidewall of the second semiconductor layers.

In some embodiments, a method for forming a semiconductor device structure is provided. The method for forming a semiconductor device structure includes forming a fin structure with alternating first semiconductor layers and second semiconductor layers stacked over a substrate. The method for forming a semiconductor device structure also includes forming a dummy gate structure across the fin structure. The method for forming a semiconductor device structure also includes forming spacer layers over opposite sides of the dummy gate structure. The method for forming a semiconductor device structure also includes partially removing the fin structure exposed by the dummy gate structure. The method for forming a semiconductor device structure also includes recessing a sidewall of the first semiconductor layers. The method for forming a semiconductor device structure also includes forming an inner spacer over the sidewall of the first semiconductor layers, wherein the inner spacer partially overlaps the spacer layer. The method for forming a semiconductor device structure also includes growing source/drain epitaxial structures over opposite sides of the fin structure. The method for forming a semiconductor device structure also includes removing the dummy gate structure and the first semiconductor layers. The method for forming a semiconductor device structure also includes forming a gate structure surrounding the second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a fin structure formed over a substrate;
nanostructures formed over the fin structure;
a gate structure wrapped around the nanostructures;
a first inner spacer formed beside the gate structure;
a second inner spacer formed beside the first inner spacer;
spacer layers formed over opposite sides of the gate structure above the nanostructures; and
source/drain epitaxial structures formed over opposite sides of the fin structure,
wherein the second inner spacer has a first portion embedded in the source/drain epitaxial structures and a second portion embedded in the first inner spacer, and wherein the second portion has a thickness decreasing from a middle portion of the second inner spacer toward the nanostructures.

2. The semiconductor device structure as claimed in claim 1, wherein the first inner spacer is laterally recessed from a sidewall of the nanostructures.

3. The semiconductor device structure as claimed in claim 1, wherein the second inner spacer is formed over a sidewall of a lower portion of the spacer layers.

4. The semiconductor device structure as claimed in claim 1, wherein the first inner spacer and the second inner spacer are made of different materials.

5. The semiconductor device structure as claimed in claim 1, wherein the first inner spacer and the source/drain epitaxial structures are separated by the second inner spacer.

6. The semiconductor device structure as claimed in claim 1, wherein a boundary between the first inner spacer and the gate structure is under the spacer layers.

7. The semiconductor device structure as claimed in claim 1, wherein the first inner spacer has a crescent shape.

8. A method for forming a semiconductor device structure, comprising:
forming a fin structure with alternating first semiconductor layers and second semiconductor layers stacked over a substrate;
forming a dummy gate structure across the fin structure;
forming spacer layers over opposite sides of the dummy gate structure;
forming source/drain openings in the fin structure beside the dummy gate structure;
laterally etching the first semiconductor layers from the source/drain openings;
depositing a first inner spacer over the sidewall of the first semiconductor layers;
depositing a second inner spacer over the sidewall of the first inner spacer;
growing source/drain epitaxial structures in the source/drain openings;
removing the dummy gate structure and the first semiconductor layers to form a gate opening between the second semiconductor layers; and
forming a gate structure in the gate opening surrounding the second semiconductor layers,
wherein the second inner spacer laterally extends and protrudes from a sidewall of the second semiconductor layers, and
a cross-sectional area of the second inner spacer is greater than a cross-sectional area of the first inner spacer in a same cross-sectional view.

9. The method for forming the semiconductor device structure as claimed in claim 8, further comprising:
growing a dummy layer over a sidewall of the second semiconductor layers before growing the second inner spacer; and
removing the dummy layer after depositing the second inner spacer.

10. The method for forming the semiconductor device structure as claimed in claim 9, wherein a sidewall of the dummy layer is aligned with a sidewall of the second inner spacer.

11. The method for forming the semiconductor device structure as claimed in claim 9, wherein growing a second inner spacer comprises:
forming a second inner spacer material over a sidewall of the first inner spacer and a sidewall of the dummy layer; and
removing the second inner spacer material over the sidewall of the dummy layer.

12. The method for forming the semiconductor device structure as claimed in claim 9, wherein the dummy layer is grown over the substrate between the fin structures and is removed before growing the source/drain epitaxial structures.

13. The method for forming the semiconductor device structure as claimed in claim 9, wherein a ratio of a thickness of the dummy layer to a thickness of the first semiconductor layers is in a range of about 0.2 to about 0.5.

14. The method for forming the semiconductor device structure as claimed in claim 8, further comprising:
growing the second inner spacer over a sidewall of the spacer layers; and
removing the second inner spacer exposed from the source/drain epitaxial structures after growing the source/drain epitaxial structures.

15. The method for forming the semiconductor device structure as claimed in claim 8, wherein the second inner spacer is selectively grown over the first inner spacer.

16. A method for forming a semiconductor device structure, comprising:
forming a fin structure with alternating first semiconductor layers and second semiconductor layers stacked over a substrate;
forming a dummy gate structure across the fin structure;
forming spacer layers over opposite sides of the dummy gate structure;
partially removing the fin structure exposed by the dummy gate structure;
recessing a sidewall of the first semiconductor layers;
forming an inner spacer over the sidewall of the first semiconductor layers, wherein the inner spacer partially overlaps the spacer layers and is formed over a sidewall of a lower portion of the spacer layers;
growing source/drain epitaxial structures over opposite sides of the fin structure;
removing the dummy gate structure and the first semiconductor layers; and
forming a gate structure surrounding the second semiconductor layers.

17. The method for forming the semiconductor device structure as claimed in claim 16, further comprising:
forming a contact structure over the source/drain epitaxial structures,
wherein the inner spacer overlaps the contact structure in a top view.

18. The method for forming the semiconductor device structure as claimed in claim 16, wherein a minimum width of the inner spacer is in a range of about 2 nm to about 8 nm.

19. The method for forming the semiconductor device structure as claimed in claim 16, wherein growing the inner spacer comprises:
   depositing an inner spacer material over a sidewall of the first semiconductor layers and second semiconductor layers; and
   removing the inner spacer material over the sidewall of the second semiconductor layers.

20. The method for forming the semiconductor device structure as claimed in claim 16, wherein a width of a middle portion of the inner spacer is wider than a width of a top portion of the inner spacer.

* * * * *